United States Patent
Arlinsky et al.

(10) Patent No.: US 11,221,349 B2
(45) Date of Patent: Jan. 11, 2022

(54) ROBOT-ASSISTED HARDWARE TESTING

(71) Applicant: POSIT SYSTEMS LTD., Yoqneam Illit (IL)

(72) Inventors: David Arlinsky, Atlit (IL); Ronit Arlinsky, Atlit (IL)

(73) Assignee: POSIT SYSTEMS LTD., Yoqneam Illit (IL)

( * ) Notice: Subject to any disclaimer, the term of this patent is extended or adjusted under 35 U.S.C. 154(b) by 89 days.

(21) Appl. No.: 16/489,139

(22) PCT Filed: Feb. 27, 2018

(86) PCT No.: PCT/IL2018/050219
§ 371 (c)(1),
(2) Date: Aug. 27, 2019

(87) PCT Pub. No.: WO2018/154586
PCT Pub. Date: Aug. 30, 2018

(65) Prior Publication Data
US 2020/0064372 A1    Feb. 27, 2020

Related U.S. Application Data

(60) Provisional application No. 62/463,845, filed on Feb. 27, 2017.

(51) Int. Cl.
*G01R 1/067*    (2006.01)
*G01R 1/073*    (2006.01)
(Continued)

(52) U.S. Cl.
CPC ........ *G01R 1/06705* (2013.01); *B25J 9/1682* (2013.01); *B25J 19/023* (2013.01); *G01R 1/07392* (2013.01); *G01R 31/2886* (2013.01)

(58) Field of Classification Search
CPC ........ G01R 1/067; G01R 1/073; G01R 31/02; G01R 31/28
See application file for complete search history.

(56) References Cited

U.S. PATENT DOCUMENTS 3,921,300 A * 11/1975 Cox ..................... G01D 5/2291
                                                      33/702
5,418,363 A *  5/1995 Elings ................... G01Q 10/06
                                                      324/260

(Continued)

*Primary Examiner* — Neel D Shah
(74) *Attorney, Agent, or Firm* — Novick, Kim & Lee, PLLC; Jae Youn Kim

(57) ABSTRACT

A system and methods are provided for robot-assisted, interactive testing of electronic circuits comprising a test fixture comprising a robotic arm, a probe, and a bracket configured to hold a unit-under-test, wherein the probe is configured to be mounted on the robotic arm and to perform a probe action, and a computer system communicatively connected to the test fixture and comprising a graphics display, a user input device. The computer system is configured to present on the graphics display a logic schematic of the unit-under-test, to receive a user selection of a target element shown on the logic schematic, to determine the corresponding physical location on the unit-under-test of said element, to move the probe to the physical location of the target element, by means of the robotic arm, and to perform one or more probe actions.

24 Claims, 16 Drawing Sheets

(51) Int. Cl.
　　　*G01R 31/28*　　(2006.01)
　　　*B25J 9/16*　　　(2006.01)
　　　*B25J 19/02*　　(2006.01)

(56) References Cited

U.S. PATENT DOCUMENTS

| | | |
|---|---|---|
| 6,208,375 B1 | 3/2001 | Kay et al. |
| 2004/0063229 A1 | 4/2004 | Gutfeldt et al. |
| 2007/0000169 A1 | 1/2007 | Pereira |
| 2007/0001691 A1* | 1/2007 | Pereira ............... G01R 31/69 |
| | | 324/750.23 |
| 2012/0185079 A1 | 7/2012 | Li et al. |
| 2012/0185097 A1* | 7/2012 | Li ..................... B25J 9/1679 |
| | | 700/259 |
| 2015/0035541 A1* | 2/2015 | Yang ................ G01R 31/2834 |
| | | 324/511 |

* cited by examiner

ROBOT-ASSISTED HARDWARE TESTING

RELATED APPLICATIONS

This application is a national phase entry of International Patent Application No. PCT/IL2018/050219, filed Feb. 27, 2018, which claims the benefit under 35 U.S.C. § 119(b) to United States Patent Application Serial No. 62/463,845, filed Feb. 27, 2017, the entire contents of which are hereby incorporated by reference.

FIELD OF THE INVENTION

The present invention is directed to systems and methods for electric hardware verification and, in particular, verification by robotic probing of an electric circuit.

BACKGROUND

Systems for electric circuit verification generally perform automated sequential or concurrent probing of multiple locations on a circuit. Such systems are generally employed for quality control of manufactured circuits and are difficult to configure for the process of debugging a circuit when a fault is detected. Consequently, laborious manual work must often be performed by technicians assigned to identify the source of a fault.

SUMMARY

Embodiments of the present invention provide a system for robot-assisted, interactive testing and debugging of electronic circuits and other types of electrical, electro-optic, and mechanical units. The system combines the high level of accuracy and convenience of robotically controlled probes, with a user interface enabling a technician to test points on a physical unit by specifying elements on a logical schematic drawing.

A system for robot-assisted, interactive testing of one or more of electrical, electro-optic, and mechanical units includes a test fixture with a robotic arm, a probe, and a bracket configured to hold a unit-under-test (UUT), wherein the probe may be configured to be mounted on the robotic arm. The system further includes a computer system communicatively connected to the test fixture and having a graphics display, a user input device, and a processor and memory, the memory comprising computer-readable instructions that when executed by the processor perform the tasks of presenting on the graphics display a logic schematic of the UUT, receiving a user selection of a target element shown on the logic schematic, determining a physical location on the UUT corresponding to the target element, moving the probe to the physical location, by means of the robotic arm, and performing one or more probe actions.

The one or more probe actions may be a measurement of a signal or a generation of a signal. The measurement may include measuring a temperature, a voltage, a current, an impedance, a signal frequency, an analog or digital electronic waveform, a height of a device, a light intensity, an image, or a pressure or force. The generation os a signal may include generating a voltage or a current, an analog or digital electronic waveform, a mechanical pressure or force, or a light emission. The processor may be further configured to receive a user input indicating a request to perform the one or more probe actions. In additional embodiments, the selected element may be a signal net or pin, the probe actions are at least one of an electrical measurement and a generation action, and moving the probe comprises moving the probe to touch an exposed surface of the UUT that is conductively connected to the signal net or pin.

Additionally, the selected element may be a device, the probe action may be a mechanical action, and the probe may be moved to touch a surface of the device. The test fixture may also include one or more signal generator modules configured to inject input signals to the UUT. The processor may also be configured to communicate instructions to the one or more signal generator modules, and the instructions may determine the input signals to be injected by the one or more signal generator modules. Furthermore, the instructions may be sequentially generated signals of a hardware emulator.

In further embodiments, the test fixture may include one or more signal receiving modules configured to receive electronic signals by one or more physical cables from the UUT and to transmit the received signals to the processor. The processor may be further configured to measure an output signal from the UUT and to display the output signal on the logic schematic on the graphics display.

The processor may be further configured to present the output signal on the graphics display together with at least one of a stored model signal. a reference circuit board and a second circuit board, and measuring the output signal may include comparing an output of the reference circuit board with an output of the second circuit board.

Additionally the processor may be configured to measure an output signal from the UUT and to record the output signal in a memory. The test fixture also may include multiple probes, and the robotic arm may be configured to select an appropriate probe to perform the probe action. The robotic arm may be further configured to calibrate the position of the probe relative to the robotic arm. The computer system may be a remote computer system connected by an Internet or dedicated remote connection to the test fixture. The test fixture further may include a camera configured to record a camera image of the UUT, and the processor may be further configured to present the camera image on the graphics display, to receive a user input indicating a position of a fiducial marker on the camera image, to calculate the corresponding physical location of the fiducial marker on the UUT, and to record the physical location, thereby calibrating the physical positions of elements in a component placement database.

The test fixture may include multiple robotic arms. The probe may be a dual probe comprising a primary probe connected to a secondary probe, wherein the primary probe is configured to sense a voltage signal at a first physical with respect to a ground signal at a second location in contact with the secondary probe. The processor may be further configured to cause a first robotic arm of the multiple robotic arms to grasp the primary probe and to move the primary probe to the first physical location, to cause a second robotic arm of the multiple robotic arms to grasp the secondary probe and to move the secondary probe to the second physical location, and to receive the voltage signal from the primary probe.

A method is also provided for robot-assisted, interactive testing of electrical and mechanical units including providing a test fixture comprising a robotic arm, a probe, and a bracket configured to hold a unit-under-test (UUT), wherein the probe is configured to be mounted on the robotic arm, and configuring a computer system, communicatively connected to the test fixture and comprising a graphics display, a user input device, and a processor and memory, the memory comprising computer-readable instructions, such that when executed by the processor perform the tasks of: presenting on the graphics display a logic schematic of the UUT, receiving a user selection of a target element shown on the logic schematic, determining a physical location on the UUT corresponding to the target element, moving the probe to the physical location, by means of the robotic arm, and performing one or more probe actions.

The present invention will be more fully understood from the following detailed description of embodiments thereof.

BRIEF DESCRIPTION OF DRAWINGS

The accompanying drawings illustrate embodiments of the disclosed subject matter and together with the detailed description serve to explain principles of embodiments of the disclosed subject matter. Structural details are shown only as needed for a fundamental understanding of the disclosed subject matter and various ways in which it may be practiced.

DETAILED DESCRIPTION OF THE INVENTION

In the following detailed description of various embodiments, reference is made to the accompanying drawings that form a part thereof, and in which are shown by way of illustration specific embodiments in which the invention may be practiced. It is understood that other embodiments may be utilized and structural changes may be made without departing from the scope of the present invention.

Figure 1A:
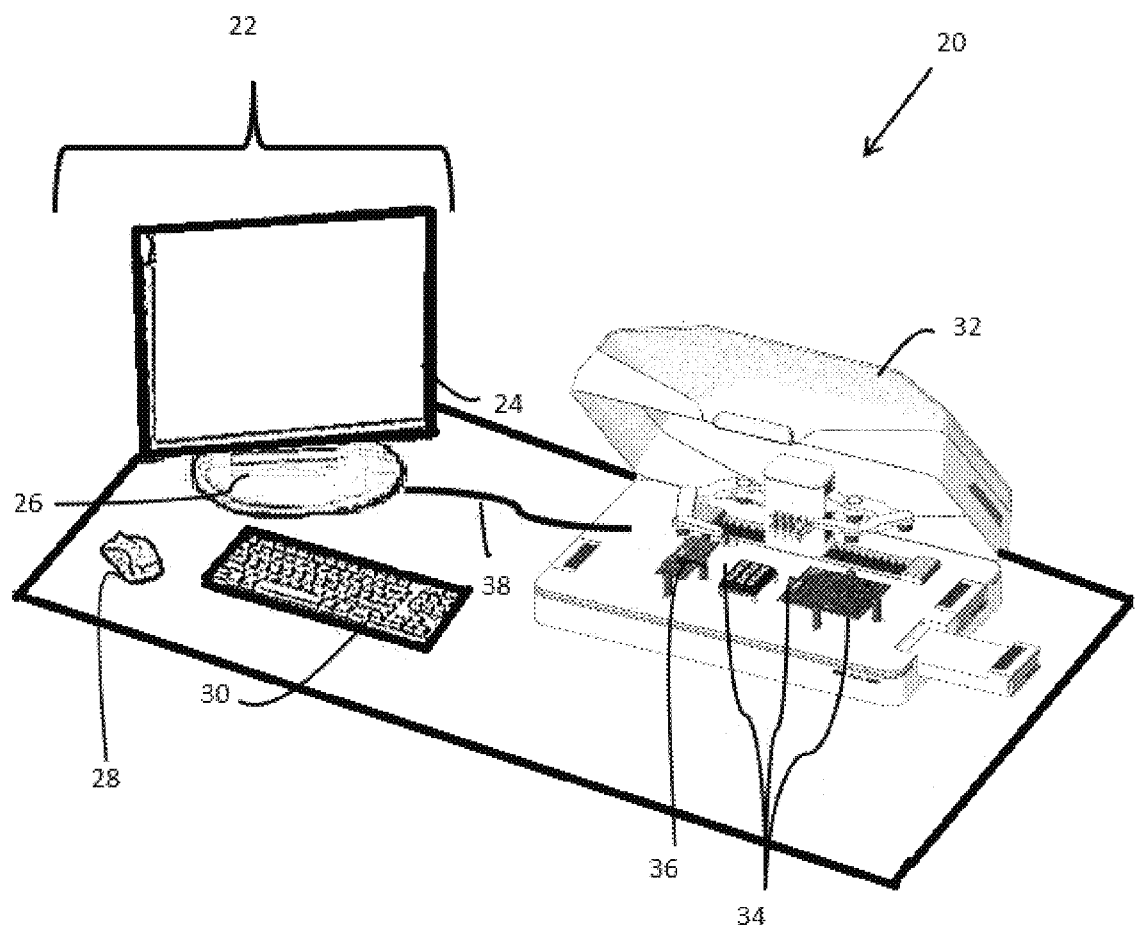
FIGS. 1A and 1B are pictorial illustrations of a system for robot-assisted, interactive circuit testing, in accordance with some embodiments of the present invention.
Figure 1B:
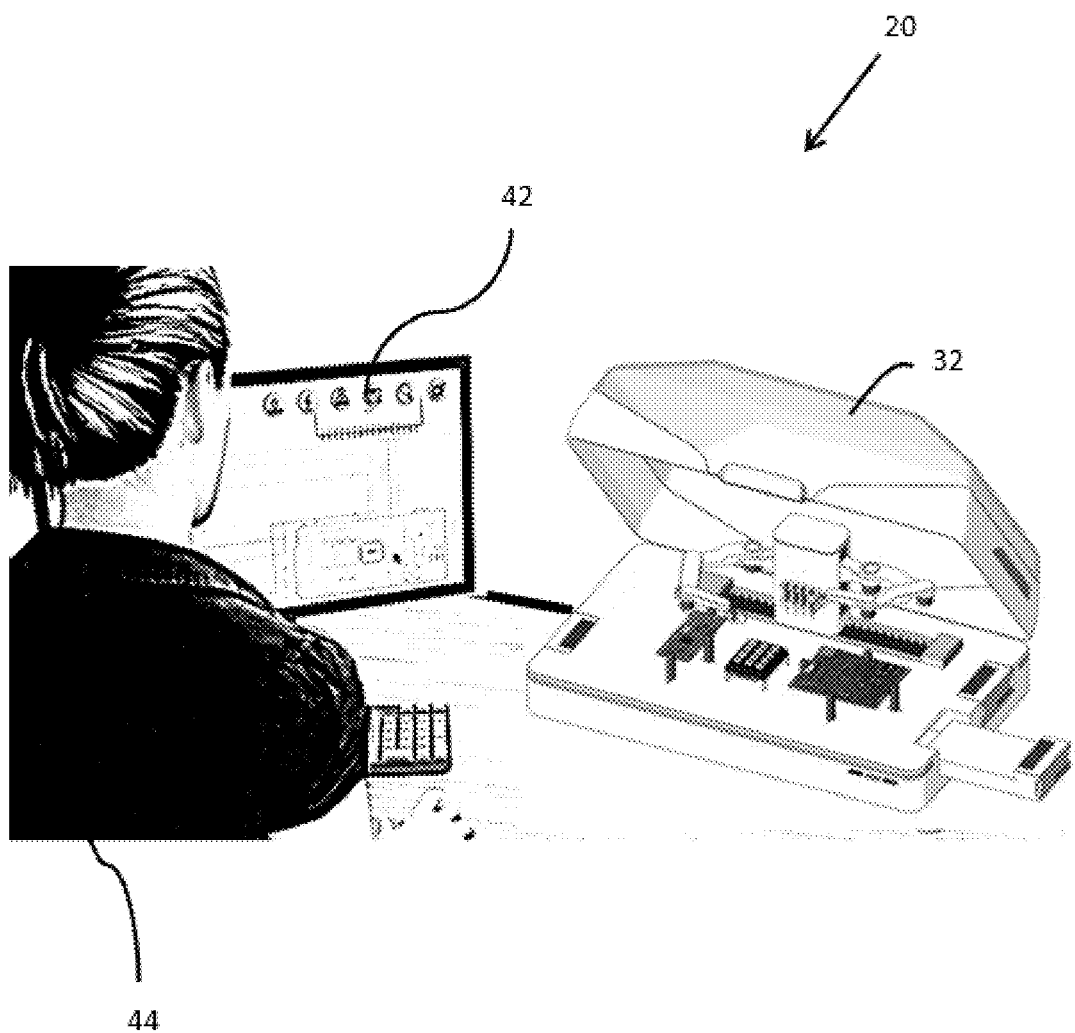

FIGS. 1A and 1B are pictorial illustrations of a system 20 for robot-assisted hardware testing of an electronic unit or circuit, in accordance with some embodiments of the present invention. As shown in FIG. 1A, the system generally includes a computer system, such as a workstation 22, which includes a user interface or graphics display 24, and a computer processor 26. The computer processor, also referred to hereinbelow as a processor, or processing unit, may be local or remote, stand-alone or distributed, implementing processing technologies known in the art. The processor is generally coupled to memory storage of the workstation 22 that includes software instructions, also referred to hereinbelow as a software package or application, that, when executed, cause the processor to implement the processing steps described hereinbelow. The workstation 22 also includes user input devices, such as a mouse 28 and a keyboard 30, as well as additional I/O communications ports described further hereinbelow. The graphics display may also be a touch screen device.

The system 20 also includes a test fixture 32, in which is mounted one or more of an electric circuit 34, also referred to hereinbelow as a circuit board, or a unit-under-test (UUT). The circuit boards are generally mounted in the fixture with mounting brackets 36 to ensure a constant position during testing. Communications between the processing unit and the other devices of the system may be implemented by wired or wireless protocols known in the art. In some embodiments, signals and power may be transferred between the test fixture 32 and the processing unit over a cable 38. In additional embodiments, a user may operate a workstation that is remote from the test fixture, in which case communications from the workstation to the test fixture 32 may be implemented over the Internet or by other remote communications protocols.

Software installed on the workstation generally includes two interrelated processes, one an interactive application display process, which manages a user interface, and the second a test fixture 32 management process, which drives the test fixture 32, as described hereinbelow.

The system 20 is typically operated interactively by a user 44. Typically, the user is presented with a view or window 50 of the user interface of the interactive application. The window is presented on the graphics display.

FIGS. 2A-2E are pictorial illustrations of views of a user interface, which present on a graphics display a logical schematic drawing of a unit-under-test, in accordance with some embodiments of the present invention.

Figure 2A:
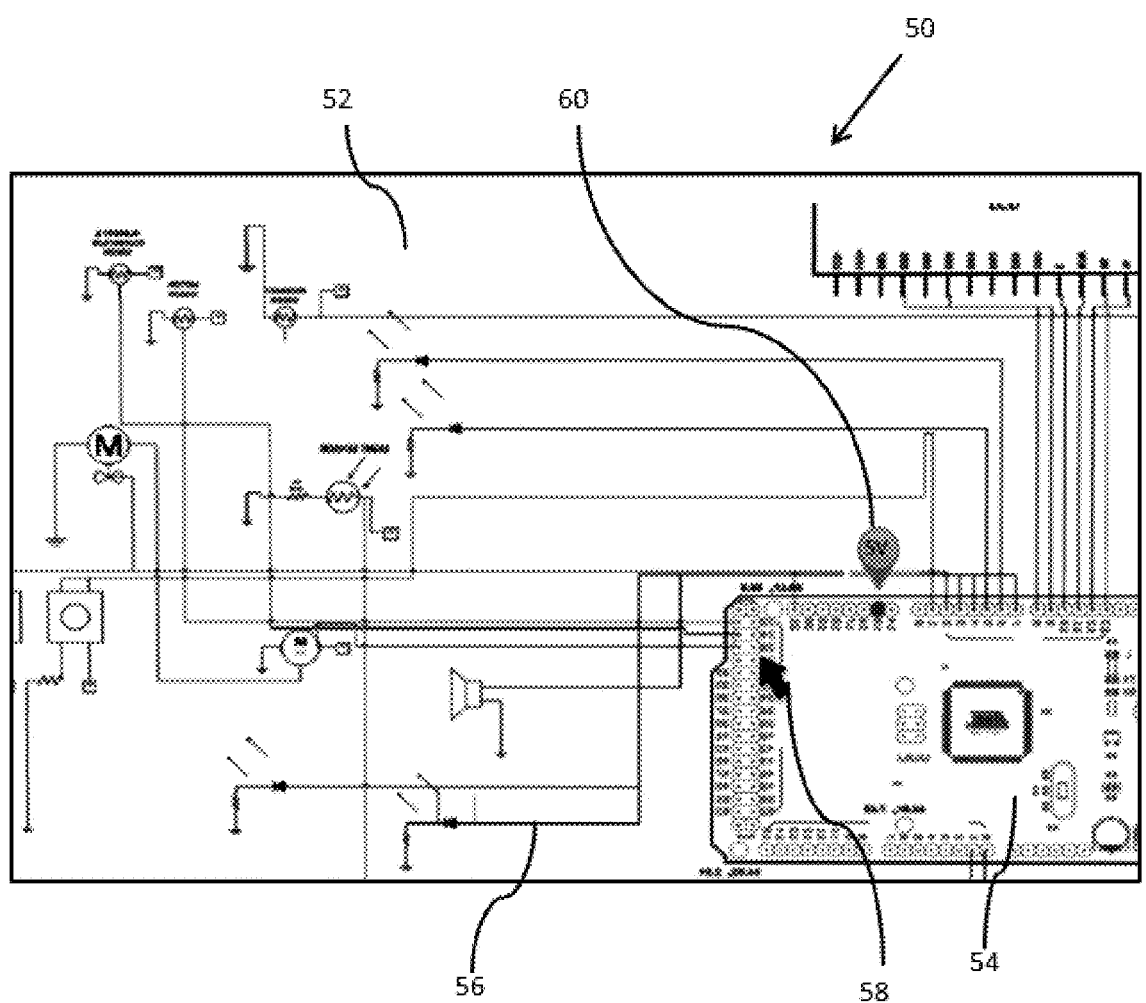
FIGS. 2A-2E are pictorial illustrations of views of a user interface, which present on a graphics display a logical schematic drawing of a unit-under-test, in accordance with some embodiments of the present invention.

FIG. 2A is a pictorial illustration of a view 50 of the user interface, presenting a logical schematic drawing 52 of the unit-under-test, or a subset of the unit. The logical schematic drawing (or, simply, "schematic"), is generally created by the processing system from one or more of the multiple computer-aided design (CAD) files that are generated during the design of the unit-under-test. The schematic includes logical representations of devices (or, "components"), which may be electrical or mechanical devices, as well as various types of transducers. The schematic drawing 52 includes a device symbol 54. The system 20 can test multiple device types, including mechanical and electrical types. Mechanical devices may include, for example, buttons, switches, and keyboards. The system may be configured to provide mechanical inputs to mechanical devices, by means of components that generate mechanical forces, such as motors, or other types of transducers. Electrical devices include devices that receive or generate electrical signals, such as computer chips and other logical devices, as well as various electrical transducers. Device types may also include membranes or light emitting or light sensing devices.

The schematic drawing also includes logical representations of the electrical pins of devices and of the connections by which electrical signals are communicated to or from the board and between devices. Pins and their connections are referred to hereinbelow as "nets", indicated in FIG. 2A as a net 56. In some embodiments, signals may be any combination of analog and digital, electrical optical, and mechanical.

A user of the system, who is typically an engineer or technician, performs tests of the unit-under-test by interactively selecting from the logical schematic drawing a target element. The target element selected may be a device or a net.

The user may indicate the target element by moving a cursor 58, so as to point to the position of the target element in the schematic and "clicking" the selection. The cursor movement may be controlled by means of the mouse, the keyboard, or by other pointing devices, such as a touchscreen.

In addition to selecting a target element, the user may indicate a type of action to be performed with respect to the selected element. For example, the user may type on the keyboard a type of action or may select the type of action from a menu provided by the application interface. Types of actions that the system may be configured to perform on an electric signal net include measurements of digital multimeter (DMM) signals, that is, measurements of current, voltage, resistance, impedance, etc. The action on a net may also be a measurement of an analog or digital electronic waveform, such as may be measured by logic analyzers or oscilloscopes. Additionally or alternatively, a signal generation action may be performed for a selected net, which may include a voltage or current generation, including injection into the net of an analog or digital electronic waveform. As described below, the system may be configured to derive input signals from a wide variety of sources, and may simulate signals from many fields, such as bus protocols, medical device signals, and actuator drive signals.

When the selected element is a device, rather than a net, measurements that may be performed by the system include height measurements (i.e., height of an element above the board surface, which may be measured by a pressure probe, providing feedback to actuators of a robotic arm), size measurements (which may be measured by processing an image or by physically tracing around a device), light measurements (sensing emissions of a light emitter), or pressure or force measurements (for example, of a membrane). Other actions may be signal generation actions, such as imposition of a mechanical pressure (e.g., pressing a button, opening a valve), or an emission of light (which may be applied, for example, to trigger a light sensor).

After the user has selected a target element and an action to perform, the system determines a physical position of the target element on the unit-under-test, and one or more probes of the test fixture 32, described further hereinbelow, are moved by the robotic arm to the physical position. If a net is selected and the action is to measure or generate an electrical signal, a probe is moved to touch an exposed surface of the unit-under-test, that is, a location conductively connected to the signal net, such as a pin or test pad. If the selected element is a device, a probe is generally moved to touch a surface of the device, in order to make a mechanical measurement, such as a temperature or pressure. If the device is a light emitter or sensor, the probe may be moved to within a certain distance above the device, as appropriate. Generally the type of target element limits the type of action that can be performed, though, for example, a temperature measurement may also be made of a pin.

After the selected action is performed on the target element, the interactive application may present on the logical schematic an indicator 60 of the test result. For example, when the selected element is a net and the action to be performed is a voltage measurement, the voltage subsequently measured, such as "5V", may appear on the schematic. The application may also indicate on the schematic which nets have been measured previously, and the user may be given the option of selecting which of the prior measurements to view.

Figure 2B:
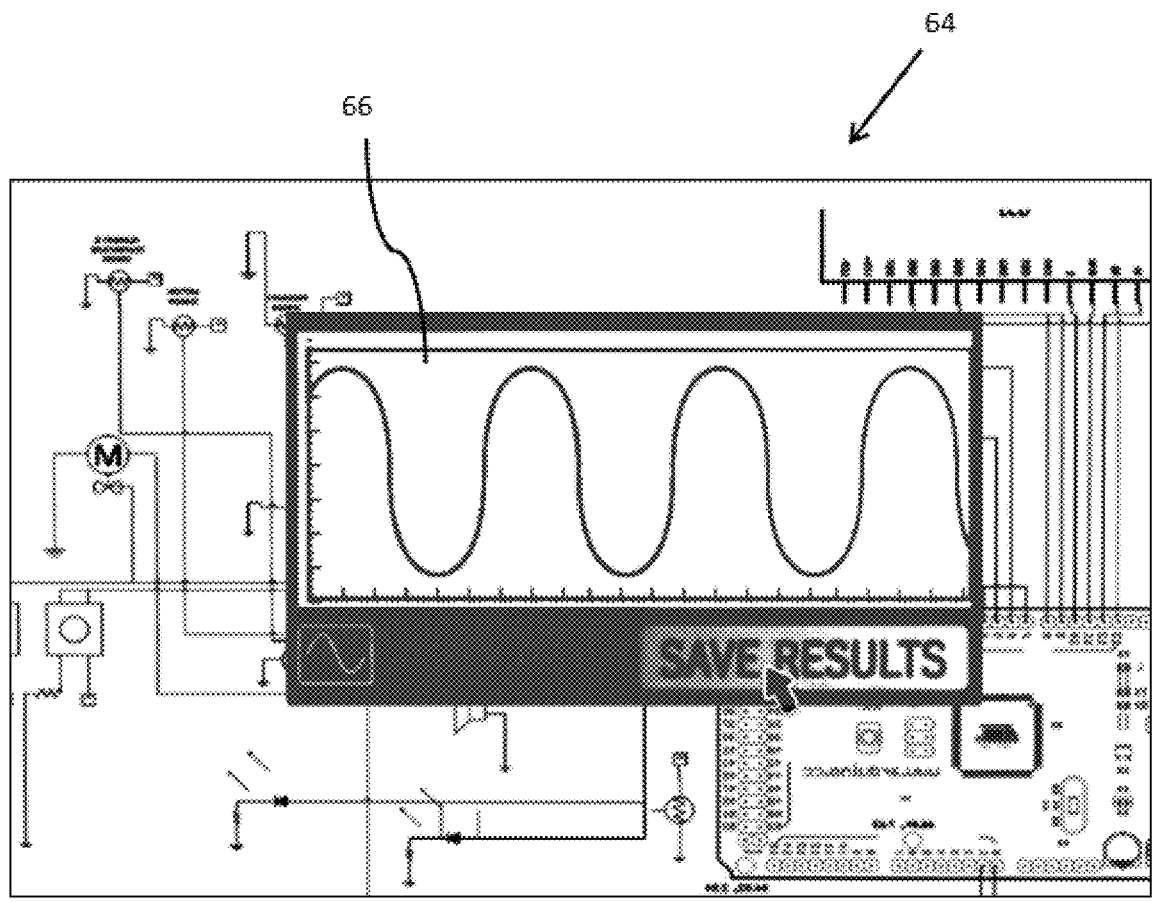

FIG. 2B shows a second view 64 of the user interface. When the selected action is a waveform measurement, the result of the measurement, such as a waveform output 66, may be presented directly over the logical schematic or in an additional window that may appear in the application.

Figure 2C:
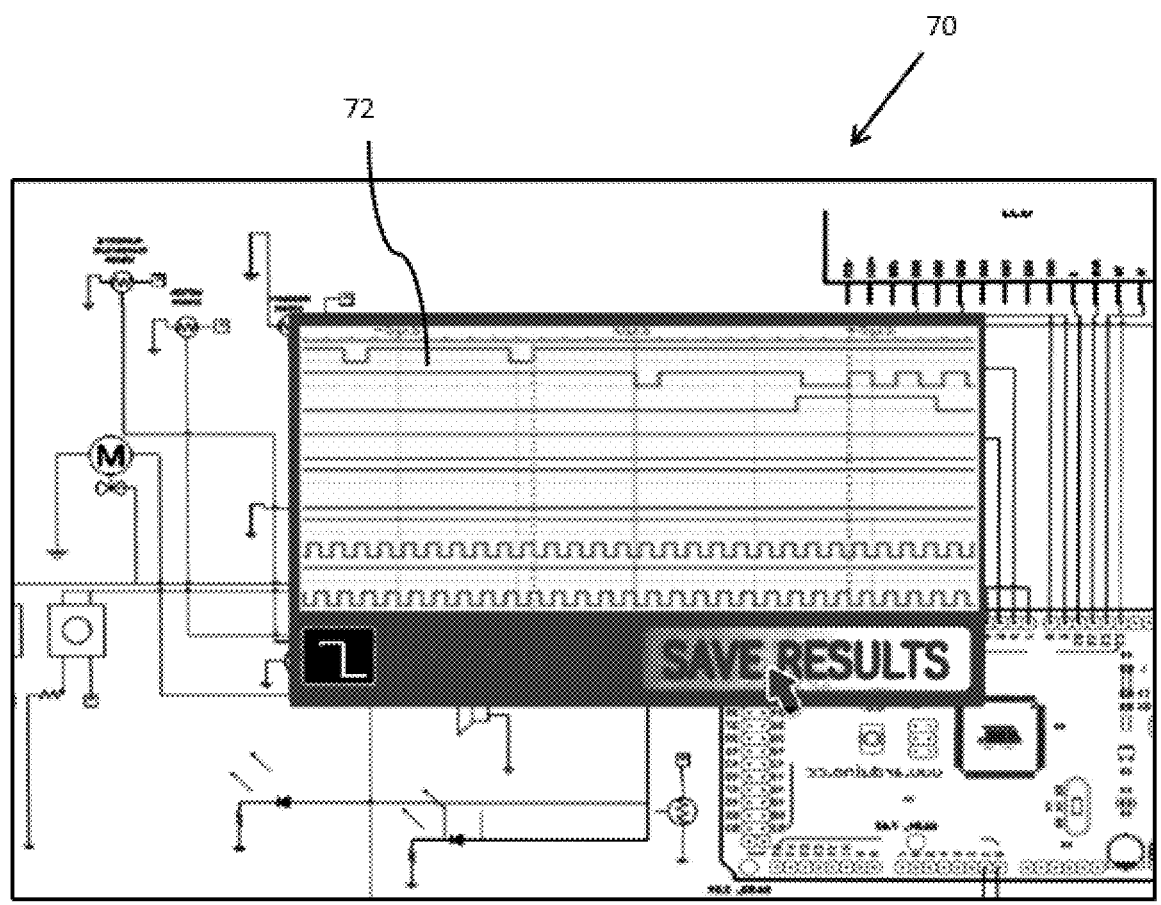

FIG. 2C shows a third view 70 of the user interface. When the selected element is a net, the user may also choose to view other signals together with the probe output of the selected net. For example, the user may choose to see other simultaneous signal outputs of the unit-under-test, and/or previously generated signals, which may have been generated either by the unit-under-test, or by other circuits or simulators. The multiple signals may be viewed together on a timing diagram 72, which may be presented directly over the logical schematic or in an additional window that may appear in the application.

Figure 2D:
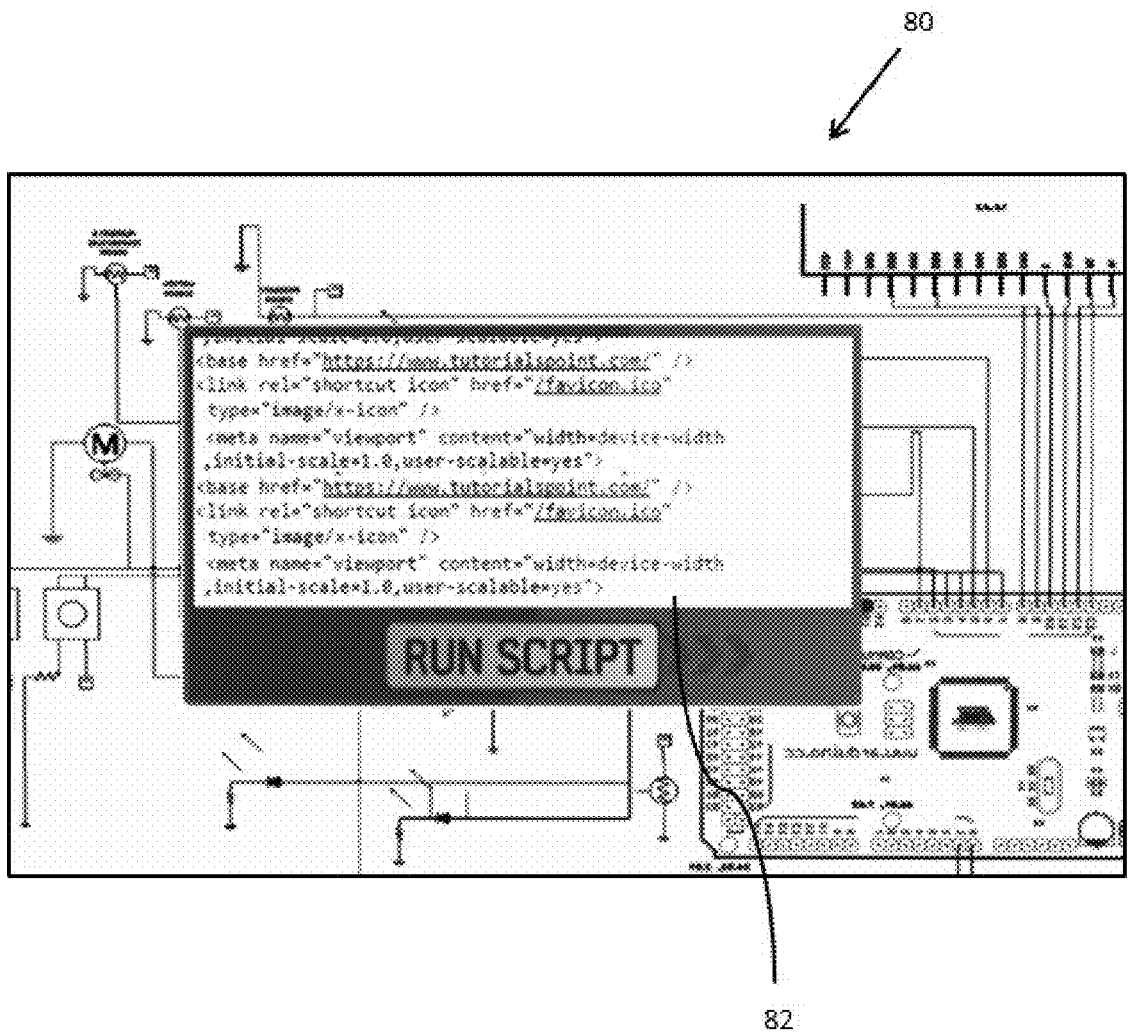

FIG. 2D shows a fourth view 80 of the user interface. In addition to selecting elements to test, actions to perform, and additional signals to view with the output, the user may select input signals to drive the unit-under-test. Generation of desired input signals may be driven by the processing system or by signal generating modules, described further hereinbelow, which may be external to the test fixture 32 or built into the test fixture. The generation of the signals may be based on test script files that specify the desired input signals and which may be modified in a test script window 82 that the interactive application presents to the user.

Figure 2E:
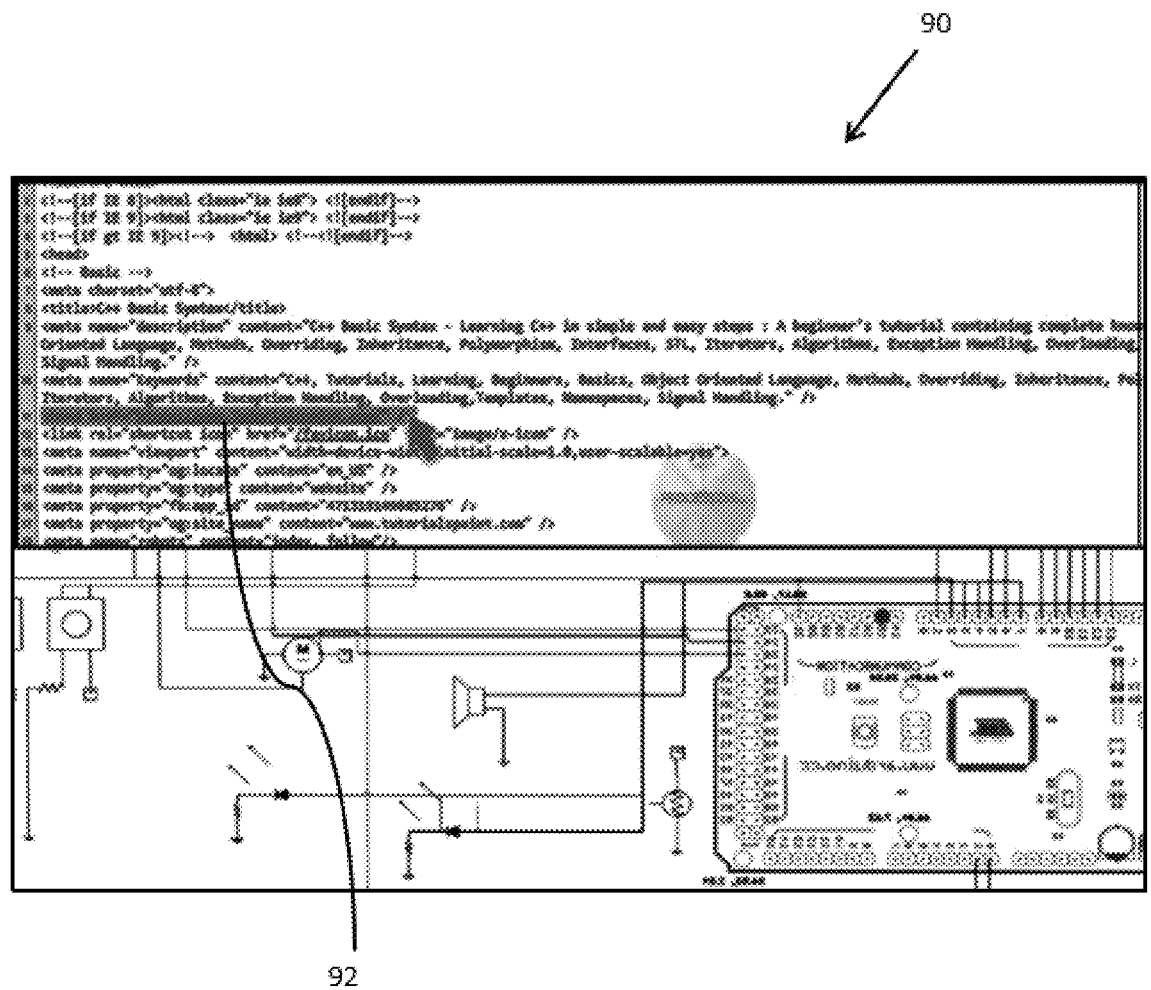

FIG. 2E shows a fifth view 90 of the user interface. The user may also select input signals for the unit-under-test by executing emulator code in a code window 92, the output of which may connected to input ports of the unit-under-test.

Figure 3:
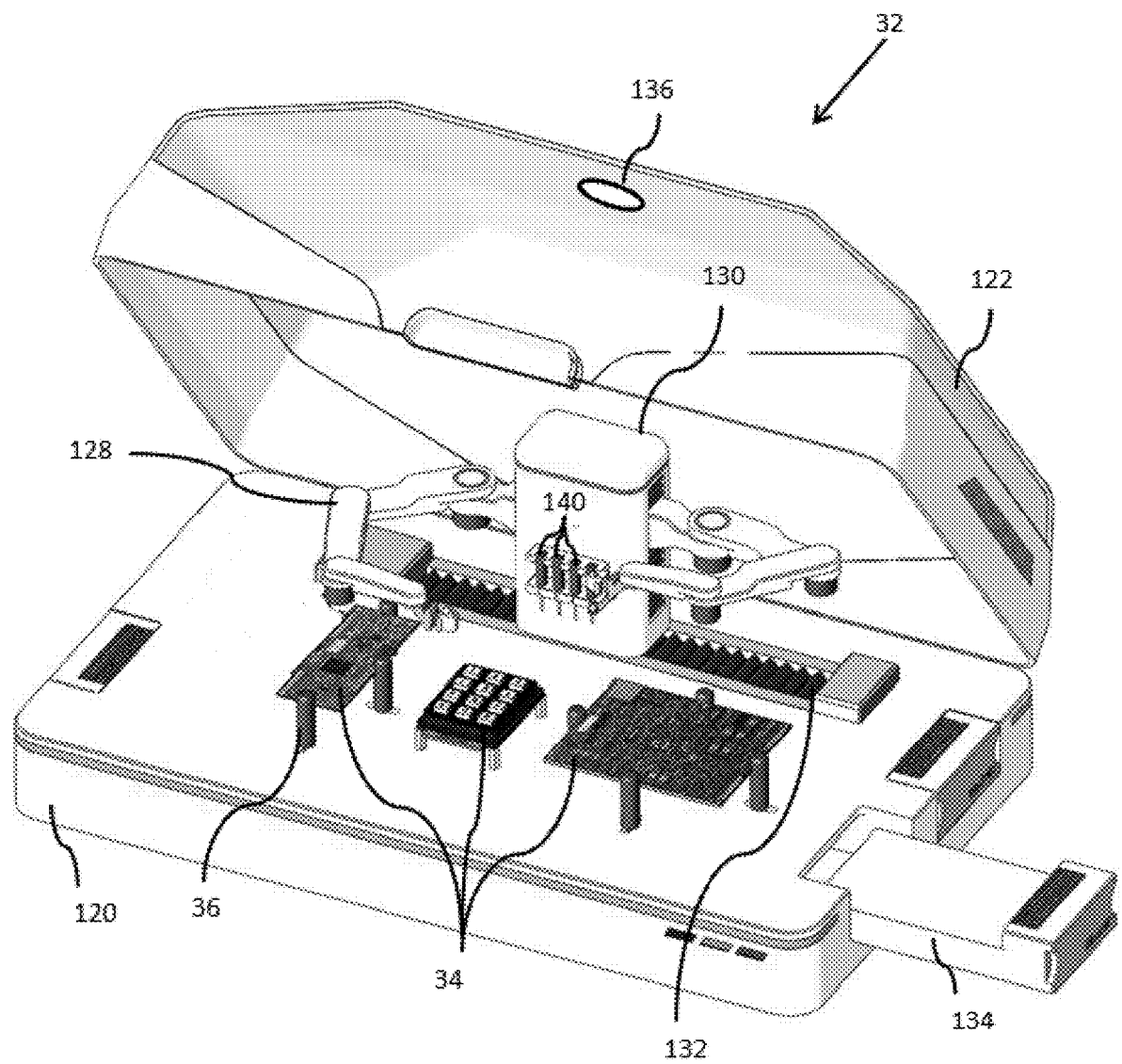
FIG. 3 is a pictorial illustration of a test fixture of the system for robot-assisted, interactive circuit testing, in accordance with some embodiments of the present invention.

FIG. 3 is a pictorial illustration of the test fixture 32 for robot-assisted hardware testing, in accordance with some embodiments of the present invention. The test fixture 32 generally includes a base 120. The test fixture 32 may also include a removable or hinged hood or cover 122, which in some configurations may be closed for convenient transport, like a briefcase or suitcase. The cover may also provide electrical shielding.

One or more of the units-under-test 34 may be mounted to the base by the brackets 36. The test fixture 32 may be provided in different sizes to accommodate a range of sizes of circuit boards.

Testing of a unit-under-test is performed using one or more probes 140, which are grasped by or mounted to one or more robotic arms 128. The robotic arms are affixed to a robotic motion controller 130, which provides signals to motors controlling joints of the robotic arms, and may also include motors for horizontal and vertical motion of the robotic arms and of the motion controller 130. The motion controller may be mounted, for example, on a track 132 to facilitate horizontal movement of the motion controller that increases the reach of the robotic arms.

The test fixture 32 may also include one or more signal modules 134. In some embodiments, the signal modules may be configured to provide signal generation or may have signal acquisition capabilities. For example, an input port of the unit-under-test may be connected by cable to a signal module configured to generate generic test signals to drive the circuit (including power supply), so that the circuit operation may be tested. Similarly, an output port or connector of the unit-under-test may be connected by cable or other means to one of the signal modules 134 configured to acquire signals generated by the circuit. Such signals may then be communicated by the same or by different communications protocols to the processor (for example, over cable 38), for storage and/or display. In additional embodiments, the output signals may be connected to a stand-alone scope or logic analyzer that is external to the workstation 22 and which provide an additional means of display for a user.

In further embodiments, I/O ports of the workstation may be configured to generate and/or to acquire input and output signals of the unit-under-test. Additionally, the processor may communicate instructions to signal generator modules, such that the instructions determine input signals to be injected by the signal modules 134 into the unit-under-test. For example, the instructions may specify a frequency and amplitude of an analog signal to be generated, or a frequency and voltage of a digital clock signal. The test fixture 32 may also be configured to provide a unit-under-test with digital or analog signals from a hardware emulator, which may be operated by the processor or by a system operating in parallel. The emulator may, for example, generate signals based on sequentially clocked instructions of a processing device being emulated.

A camera 136 may be mounted on the inner side of the cover of the test fixture 32, or in other locations of the fixture, such as a dedicated camera bracket, or on one or more positions of the robotic arms. The camera may be configured to take still images and/or videos of the unit-under-test during operation of the system. Testing may be performed either locally or remotely. To being the process of interactive testing, a user mounts one or more circuit boards in the test fixture 32, installs the appropriate probes 140 in the test fixture, and configures the workstation 22 with access to the necessary data sources for testing a target UUT. For remote operation, a user may view a video feed of the UUT to confirm that the system is operating properly. In addition, after mounting of the UUT, a user may view an image of the circuits of the UUT to calibrate the UUT positions, as described further hereinbelow. The camera may also be utilized by a process for calibrating probe positions when probes are switched.

Figure 4:
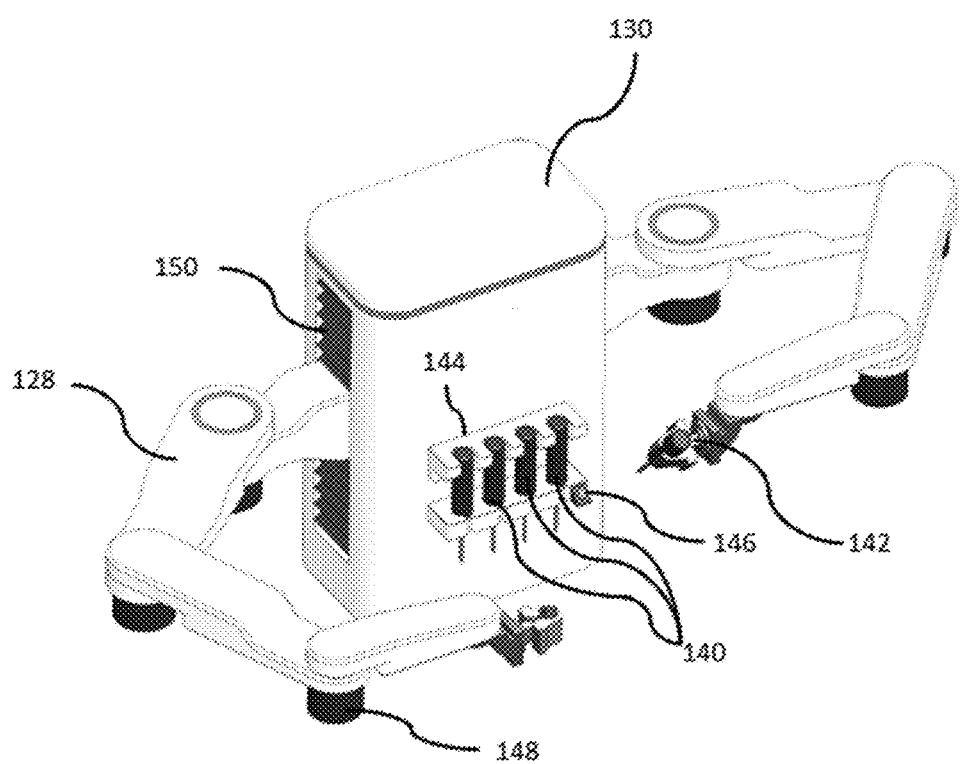
FIG. 4 is a pictorial illustration a robotic motion controller, in accordance with some embodiments of the present invention.

FIG. 4 is a pictorial illustration of the robotic arms 128 and the robotic motion controller 130, in accordance with some embodiments of the present invention. The test fixture 32 is typically configured to operate with multiple robotic arms (two are shown in the figure) and with the multiple probes 140. Types of probes include sensing probes and active probes, and some probes may also be configured with multiple capabilities. Typically each probe is configured to perform one of the types of actions described above related to either measuring (i.e., for a sensing probe) or generating signals (for an active probe). A signal sensing probe may have one or more of a temperature sensor, a voltage sensor, an analog or digital electronic waveform sensor, a height sensor, a pressure sensor, a camera and a light sensor. A signal generating probe may include one or more of a voltage generator, a current generator, an analog or digital waveform generator, a pressure actuator and a light emitter.

In some embodiments, the robotic arms are configured with grasping clamps 142 that can release probes and grasp new probes from a probe shelf, stand, or rack 144. The probe rack may be positioned on the body of the controller housing as shown or at any other convenient position within the test fixture 32. When a user specifies a probe action that requires a different probe than the probe currently installed or grasped by the robotic arm, the robotic arm returns the current probe to the stand and grasps a new probe that is configured to perform the specified action.

Typically, a probe location calibration target 146 is attached to or near the probe stand. After grasping a new probe, the robotic arm may be moved to position the probe on the target to calibrate the exact position. The calibration may be performed automatically by processing an image of the target as viewed from a camera on the robotic arm, and moving the robotic arm until the target is at the center of the image.

The robotic arms are generally configured to move horizontally in a plane above the unit-under-test until the proper location has been reached, and to then descend vertically until contact is made with the selected element. Horizontal motion is generally driven by multiple actuators or motors positioned in the joints 148 of the robotic arms. Vertical movement may be driven by actuators or motors driving a vertical track 150 within the housing of the controller, or in the clamps.

Figure 5:
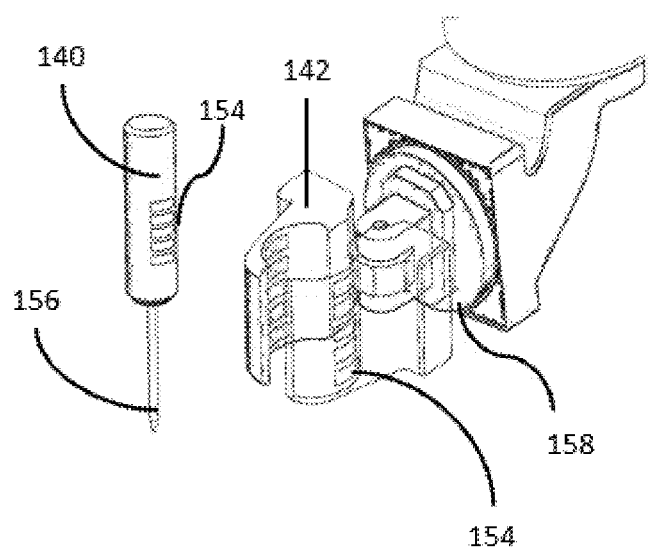
FIG. 5 is a pictorial illustration of a clamp of one of the robotic arms and of a probe, in accordance with some embodiments of the present invention.

FIG. 5 is a pictorial illustration of the clamp 142 of the robotic arm and the probe 140, in accordance with some embodiments of the present invention. The probe and the clamp have complementary contacts 154, which may be electrical and/or optical. Through the contacts, the robotic arms 128 provide power from the test fixture to operate the active and sensing probes. Also, by means of the contacts, signals measured by a sensing probe may be communicated from the probe to the processor. Similarly, signals generated by the processor or from external systems or generic testers may be transmitted through the contacts to a signal generating probe.

An extensor or pin 156 of the probe is generally a spring calibrated extension, which may be calibrated to impose a given pressure on a selected element while performing the desired action. In probes that convey electrical signals, the pin body is generally an electrically conductive material. The pin tip may be gold-plated and/or made of any appropriate material, such as titanium or steel.

One type of probe may be a mechanical probe, which may have a pin configured to permit a varying amount of pressure to be imposed. By this means, the mechanical probe may be configured to trigger different types of mechanical elements, such as switches, buttons, and keyboards. The mechanical probe may also be configured with a pressure feedback that permits the measurement of pressures as well as the measurement of heights of elements on the circuit board. The probe may also be configured to trace around a device to determine its size.

In additional embodiments, the pin of the probe may be configured to transmit a light signal or other electromagnetic or magnetic signal. The pin may include at its tip a light-emitting diode (LED) to generate an optical signal.

Probes designed to perform a given action may be implemented by various technologies known in the art. For example, a probe for temperature measurement may be designed with any one or more of known temperature sensing technologies, such as infrared sensing or thermocouple sensing.

The robotic arm clamp may also be configured with one or more axes of rotation 158, such that the probe may be positioned at various angles with respect to components on the circuit board.

Figure 6A:
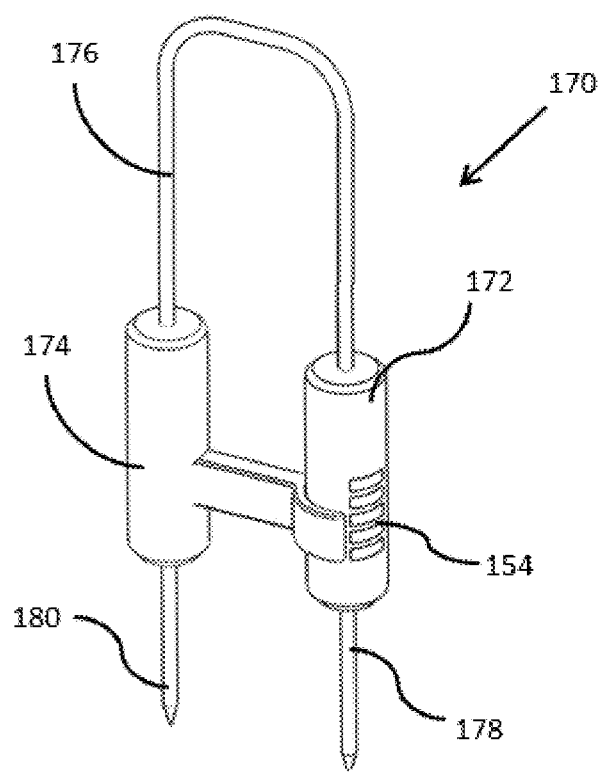
FIGS. 6A-6C are pictorial illustrations of a dual probe configuration for relative target sensing, in accordance with some embodiments of the present invention.
Figure 6B:
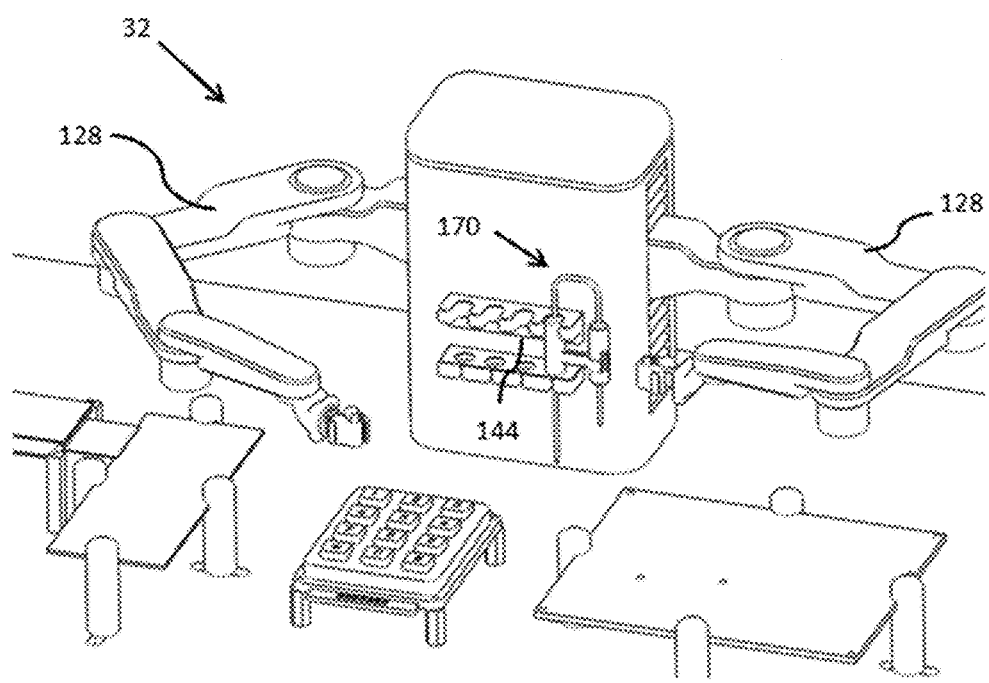
Figure 6C:
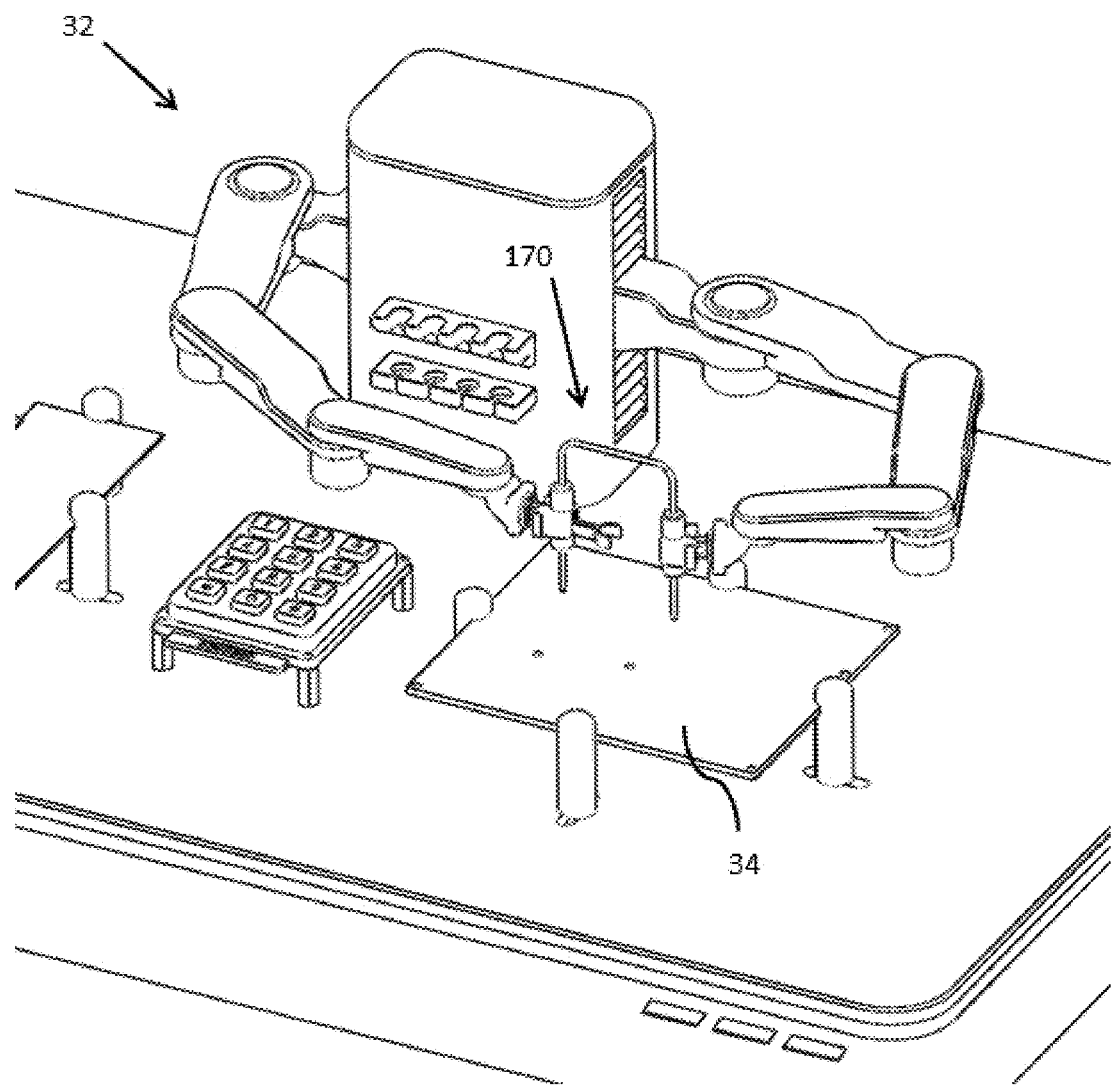

FIGS. 6A-6C are pictorial illustrations of a dual probe 170 for differential sensing, in accordance with some embodiments of the present invention. The probes 140 for sensing and generating signals generally receive a ground signal through the contacts 154. FIG. 6A is a pictorial illustration of the dual probe 170 including a primary probe 172 and a secondary probe 174. The primary probe is configured, like the probes 140 with the contacts 154 to send and receive signals from the test fixture. In addition, the primary probe 172 is configured to receive a secondary signal from the secondary probe 174, by means of a connecting wire 176. In some embodiments, the primary probe is a voltage sensor configured to measure a differential voltage between a primary pin 178 of the primary probe and a secondary pin 180 of the secondary probe 174. In particular, the primary probe may be configured to sense a signal at a target point with respect to ground, when the secondary pin 180 is in contact with a ground signal of the UUT. For example, the primary probe may be a high frequency voltage sensor, and consequently the signal sensed by the primary probe may be sensitive to a length of a cable connecting the sensor of the primary probe to ground. To reduce noise in the signal sensed by the primary pin 178, the secondary pin 180 is moved to contact a ground signal on the UUT.

FIG. 6B is a pictorial illustration of the test fixture 32 when the dual probe 170 is installed in the probe rack 144, from which the robotic arms 128 may subsequently grasp the dual probe, the primary probe 172 being grasped by one robotic arm, and the secondary probe 174 being grasped by the other robotic arm. FIG. 6C is a pictorial illustration of the test fixture 32 when the dual probe 170 has been removed from the probe rack by the robotic arms and the primary and secondary probes are positioned by the robotic arms at respective first and second target points on the circuit board 34. As described above, the secondary probe may be positioned at a ground signal of the circuit board, and the primary probe may be configured to measure a signal at the first target point with respect to a ground signal of the circuit board at the second target point.

The connecting wire 176 may include an electrically conductive wire and may also include a flexible shape memory alloy to maintain the position of the connecting wire above the robotic probe clamps 142.

Figure 7:
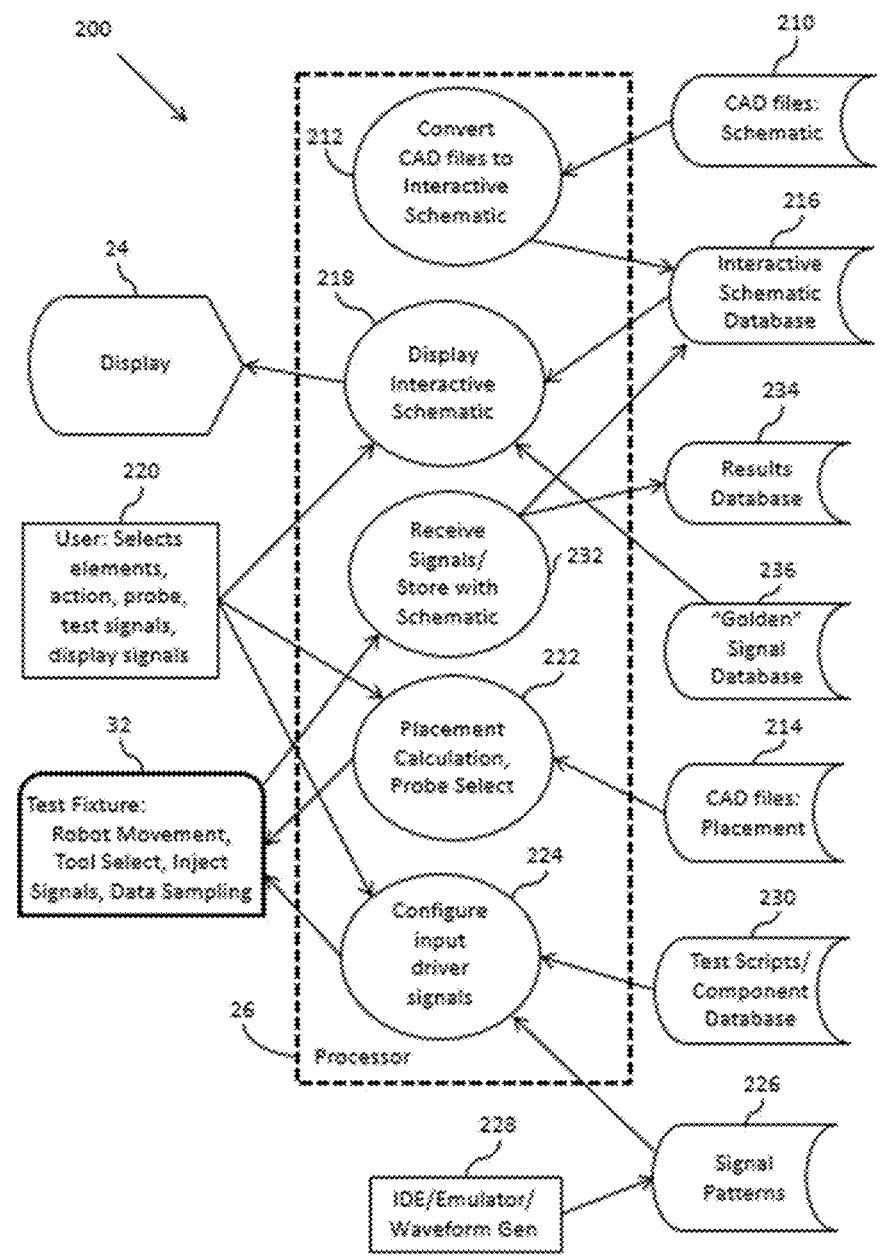
FIG. 7 is a graphical flowchart of a process for robot-assisted hardware testing, in accordance with some embodiments of the present invention.

FIG. 7 is a graphical flowchart of an interactive circuit testing process 200, in accordance with some embodiments of the present invention. The processor 26 executes software to perform multiple steps related to processing inputs—obtained from the user input devices, from the test fixture 32, and from multiple data sources—and to generating outputs—transmitted to user output devices, to the test fixture, and to multiple data repositories.

Data sources may include files or databases, stored in memory storage of the computer system, or accessible from external sources, as well as external devices configured to provide data in real time.

Testing typically begins after one or more circuit boards are mounted in the test fixture 32, after one or more probes are in the test fixture, and the computer system is configured for access to the necessary data sources related to performing tests of the circuit boards. As described above, the position of the circuit board is then calibrated.

Two data sources that are required for interactive testing are: a computer-aided design (CAD) logical schematic file 210, which contains data representing the logical schematic of the unit-under-test; and a computer-aided design (CAD) component placement file 214, which provides placement coordinates of devices and net routes of the printed circuit board (PCB) being tested, that is, the unit-under-test.

At a processing step 212, which the user initiates when setting up the system, the processor converts the CAD logical schematic files to the format of the interactive schematic database 214. This format includes the data by which the processor runs the interactive application process, described above with respect to FIG. 2A. The schematic is then presented on the graphics display 24, and the user may then work interactively at the workstation, providing various input instructions 220 to the processor.

As described hereinabove, the input instructions from the user include a selection of an element to be tested. The processor, at a processing step 222, receives this instruction and correlates the selected element with a position of the associated device or net specified in the (CAD) component placement file 214.

The CAD placement file may include several possible coordinates for a target element, for example when a net on the physical board includes multiple possible test pads. The processor may be configured to determine an optimal set of coordinates. Alternatively or additionally, the processor may be configured to allow the user to make an interactive selection from the possible coordinate options.

The user also may provide an action selection, which establishes the type of test operation to be performed. The action selection generally indicates the type of measurement or signal generation to be performed, which in turn determines the type of probe that is selected.

After determining the coordinates and the probe, the processor sends the appropriate signals or instructions to the test fixture 32, causing the selection of the appropriate probe and the movement of the robotic arms to the location on the unit-under-test where the probe action is to be performed.

Generally the input instructions from the user indicate conditions of the unit-under-test that are to be set, that is, the input signals that may be provided to the board, as well as to the probe (when a signal generating probe action is specified). Board input signals may be generated or transmitted through the test fixture modules, as described above. Additionally or alternatively, devices external to the system may be applied to generate the desired input signals, both for the probe and for input ports of the unit-under-test. The signals may be generated, for example, by an external power supply, a waveform generator, a generic test signal generator, or an external emulator. A wide range of signal generators may be applied, including generators that provide medical signals, actuator signals, or communication bus protocol signals.

When two or more robotic arms are available, the user may repeat the element and action selection process for each available arm. In some embodiments, the user specifies one probe for providing an input signal, and the other probe for measuring the resulting output. In further embodiments, the user may specify multiple tests to be performed sequentially, or at a future time, specifying for each test the element to be tested and the action to be performed.

At a processing step 224, in response to the user input specifying the types of input signals to be provided to the unit-under-test, the processor retrieves signal patterns or causes the necessary signals to be generated. Signal patterns may be retrieved from an input signal file or database 226. Input signal waveforms may be generated by a signal emulator or waveform generation package 228. As described above with respect to FIG. 2E, the interactive application may present emulator code to the user, enabling the user to inject a sequential series of signals to the unit-under-test. Also as described above, with respect to FIG. 2D, the interactive application may present test scripts to the user, from a test script or component logic database 230. Editing test scripts enables the user to control the injection of signals from pre-defined signal files.

After the probe has been moved to the specified element on the unit-under-test and input signals are applied, the processor begins receiving output results from the test fixture at a processing step 232. Outputs from the unit-under-test, including the output of a sensing probe, may also be measured by external devices, such as a digital multimeter (DMM) or logic analyzer.

Output signals, including the sensor measurements of the probe or probes, may be stored to a results file or database 234. Results may be stored per net, so as to create a results report. The results may also be stored with the schematic in the interactive schematic database, so as to be displayed to the user, as described above with respect to FIGS. 2A-2C. The user may also specify comparison signals 236 to be displayed with the result signals. Comparison signals, also referred to as "golden" signals may be from a circuit simulator package, or from prior or simultaneous operation of an identical circuit known to be performing properly. In some embodiments, two circuits may be tested in parallel, one of which provides known ("model") results, such that the outputs of the two circuits may be compared. As described above with respect to FIG. 2A, numerical output, such as DMM or temperature measurements, may be presented directly on the schematic diagram near the logical representation of the element tested. Results that differ from model results may be indicated by highlighting, for example, by a red font.

Figure 8:
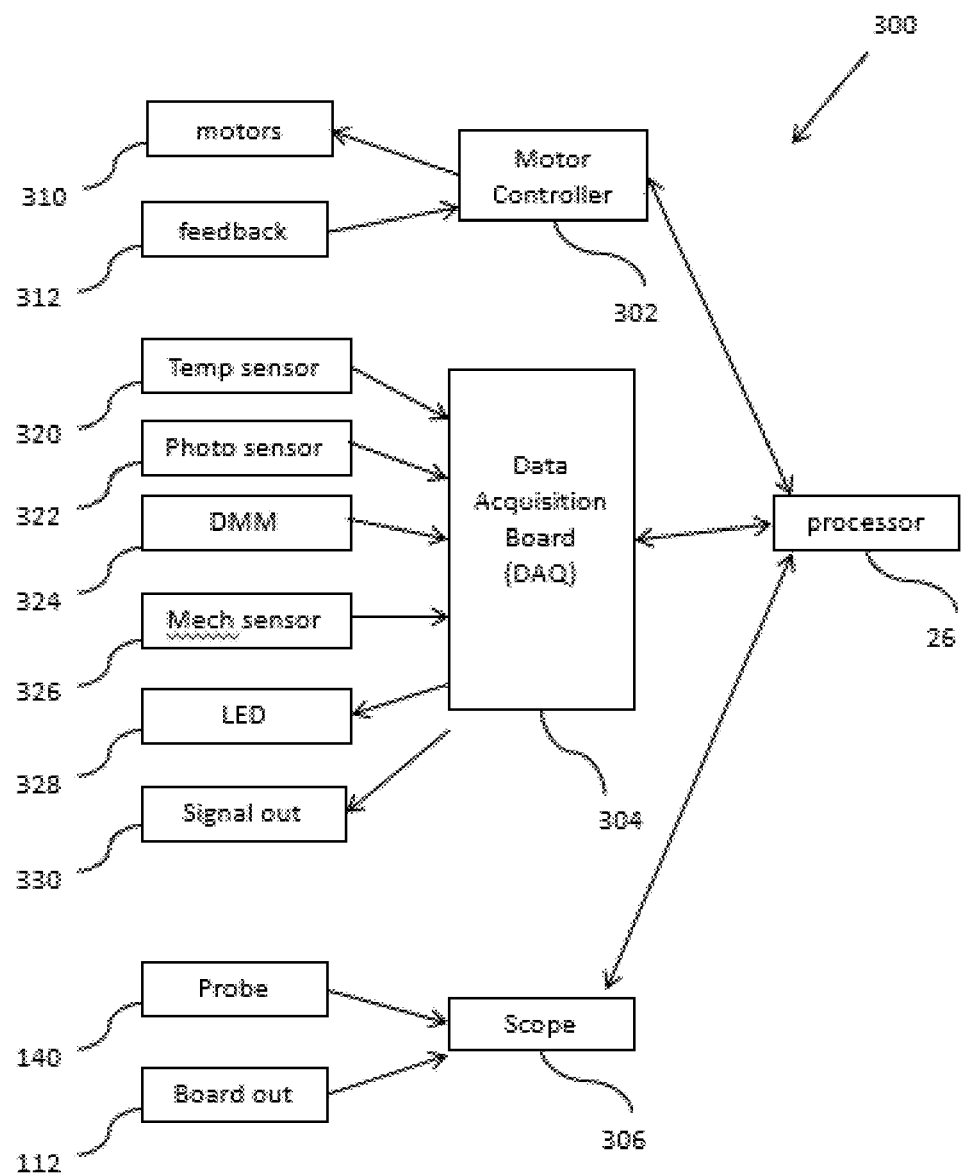
FIG. 8 is a graphical flowchart of communications of a processor configured to control robot-assisted hardware testing, in accordance with some embodiments of the present invention.

FIG. 8 is a graphical flowchart of communications processes 300 implemented by the processor 26 to control the test fixture, in accordance with some embodiments of the present invention. To implement the process 200 described above, the processor 26 typically communicates with multiple devices including a motor controller 302, a data acquisition board (DAQ) 304 and a logic analyzer or scope 306.

The motor controller may be multiple controllers and may be configured to control positioning of the robotic arm or arms. Multiple actuators or motors 310 may control the positioning of the probe in the clamp of the robotic arm. These may include multiple joint motors, a vertical height motor, and clamp grasp and release motor, and a rotational position motor at the clamp joint. Each motor also has an associated position sensor 312 to provide positional feedback to the controller to maintain calibration. The motor controller may be configured to receive positional coordinates of the selected element, and to send the proper motor signals to the multiple motors to guide the robotic arm to the proper coordinates. Additional instructions by the processor include signals for performing a probe replacement, whereby the robotic arm returns a probe to the probe stand and grasps a new probe. The motor controller may be included in the robotic motion controller 130. The motor controller may also include a processor, such that the processor of the computer system is effectively a distributed processor, that is, a portion of the processing tasks described herein with respect to the processor of the computer system are performed by the motor controller. For example, the computer system may send a "new probe" instruction to the motor controller, which may be configured to determine the position of the new probe in the probe stand of the test fixture and to determine the necessary signals for moving the robotic arms to perform the probe replacement process.

The signals generated or acquired by the test probes and/or circuit board inputs and outputs may be generated or acquired by DAQ 304, which may be a board in the workstation or an external device.

Signals received from the probes may include measurements from a temperature sensor 320, a photo sensor 322, a digital multimeter (DMM) output 324, and a mechanical sensor 326, which may include, for example, a measurement of a height of an element.

Signals transmitted to probes may include a signal to operate an LED 328, or any other electrical signal 330.

Waveform outputs of the probes 140 and/or connectors of the circuit boards and/or modules may be connected directly to the scope 306, which may be incorporated into the workstation or maintained as an external device. Users may view output on the scope, which may be controlled by the processor or manually be the user. Scope output may also be transmitted to the processor for storing test results.

Figure 9:
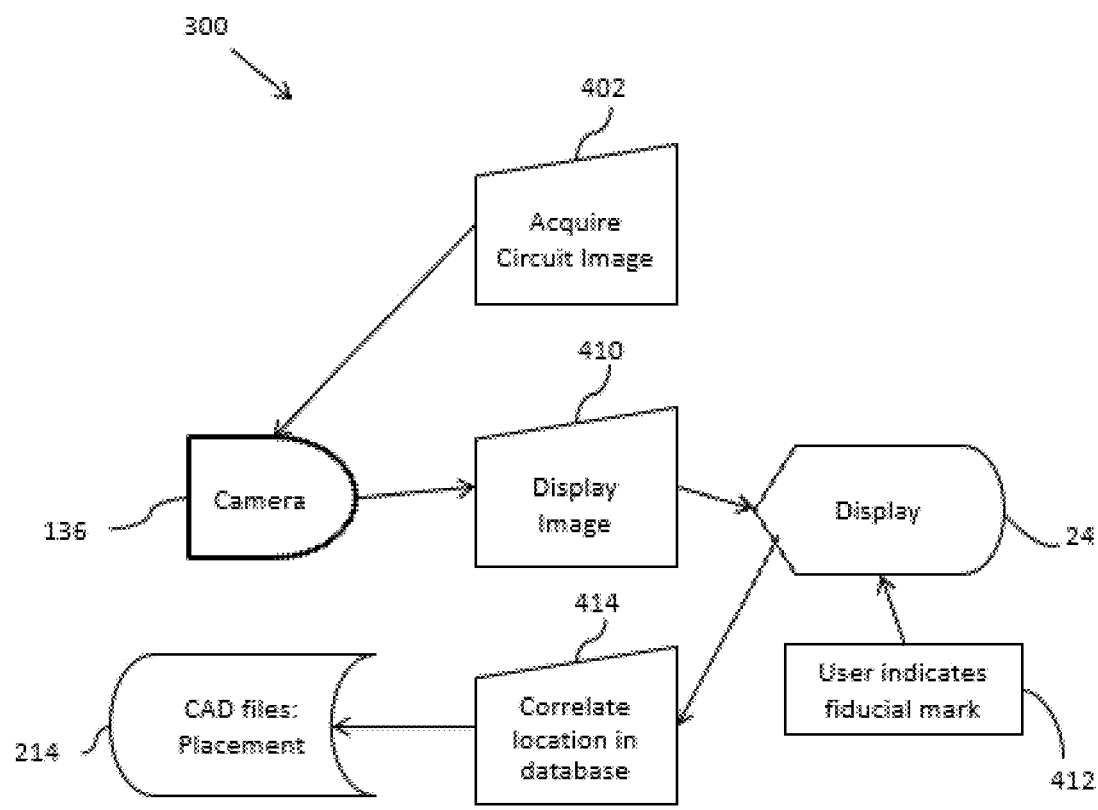
FIG. 9 is a graphical flowchart of a process for calibrating the position of a unit-under-test, in accordance with some embodiments of the present invention.

FIG. 9 is a graphical flowchart of a calibration process 400 for calibrating the position of the unit-under-test, in accordance with some embodiments of the present invention. Typically, the calibration process is performed by the user after mounting one or more circuits in the test fixture. Upon initiation of the calibration process, the processor acquires at a step 402 an image of the circuit by triggering image acquisition by the camera 136. At a step 410, the processor presents the image on the display 24. By means of one of the input devices of the workstation, the user provides a position input 412, indicating coordinates on the image of one or more fiducial marks. The user may also repeat the process when multiple circuit boards are mounted for testing. At a step 414, the processor stores the physical coordinates of the fiducial marks thereby correlating the physical position with the relative position coordinates of the circuit placement data in the CAD placement files 214.

Processing elements of the system 20 and of the processes 200 and 400 can be implemented in digital electronic circuitry, or in computer hardware, firmware, software, or in combinations thereof. Such elements can be implemented as a computer program product, tangibly embodied in an information carrier, such as a machine-readable storage device or in a propagated signal, for execution by, or to control the operation of, data processing apparatus, such as a programmable processor, computer, or deployed to be executed on multiple computers at one site or distributed across multiple sites. Memory storage may also include multiple distributed memory units, including one or more types of storage media. Examples of storage media include, but are not limited to, magnetic media, optical media, and integrated circuits such as read-only memory devices (ROM) and random access memory (RAM). The system may have one or more processors and one or more network interface modules. Processors may be configured as a multi-processing or distributed processing system. Network interface modules may control the sending and receiving of data packets over networks.

Method steps associated with the system and process can be rearranged and/or one or more such steps can be omitted to achieve the same, or similar, results to those described herein. It is to be understood that the embodiments described hereinabove are cited by way of example, and that the present invention is not limited to what has been particularly shown and described hereinabove. Rather, the scope of the present invention includes variations and modifications thereof which would occur to persons skilled in the art upon reading the foregoing description and which are not disclosed in the prior art.

The invention claimed is:

1. A system for robot-assisted, interactive testing of one or more electrical, electro-optic, and mechanical units, comprising:
   a test fixture comprising a robotic arm, a probe, and a bracket configured to hold a unit-under-test (UUT), wherein the probe is configured to be grasped by the robotic arm, wherein the robotic arm comprises grasping clamps for grasping and releasing the probe; and a computer system communicatively connected to the test fixture and comprising a graphics display, a user input device, and a processor and memory, the memory comprising computer-readable instructions that when executed by the processor perform the steps of:

presenting on the graphics display a logic schematic of the UUT, receiving a user selection of a target element shown on the logic schematic, correlating the selected target element with a specification of the target element in a component placement file (CPF) describing the UUT;

determining from the specification of the target element in the CPF, coordinates of a physical location on the UUT corresponding to the target element, receiving a user input indicating one or more probe actions to perform with respect to the target element, moving the probe to the physical location indicated by the coordinates from the CPF, by means of the robotic arm, and performing the one or more probe actions, at the physical location, wherein the one or more probe actions comprise measurement or generation of one or more signals.

2. The system of claim 1, wherein the target element is a signal net displayed on the logic schematic, wherein determining the physical location of the target element from the CPF comprises determining coordinates of an exposed test pad of the UUT that is conductively connected to the signal net.

3. The system of claim 1, wherein the target element is a device, and wherein the one or more probe actions is an application of a force to the device causing the device to perform a mechanical action.

4. The system of claim 1, wherein the test fixture further comprises one or more signal generator modules configured to inject input signals to the UUT through the probe at an exposed test pad of the UUT, wherein the processor is further configured to communicate instructions to the one or more signal generator modules, and wherein the instructions determine the input signals to be injected by the one or more signal generator modules.

5. The system of claim 1, wherein the signals are sequentially generated signals of a hardware emulator.

6. The system of claim 1, wherein the processor is further configured to measure an output signal from the UUT and to display the output signal on the logic schematic on the graphics display.

7. The system of claim 6, wherein the processor is further configured to present the output signal on the graphics display together with at least one of a stored model signal.

8. The system of claim 6, wherein the UUT comprises a reference circuit board and a second circuit board, and wherein measuring the output signal comprises comparing an output of the reference circuit board with an output of the second circuit board.

9. The system of claim 1, wherein the test fixture further comprises a probe rack containing multiple probes including the probe, and wherein moving the probe to the physical location comprises moving the robotic arm to grasp the probe from the probe rack and subsequently moving the robotic arm, while grasping the probe, to the physical location to perform the one or more probe actions.

10. The system of claim 9, wherein the one or more probe actions comprise measurement of a temperature of a device on the UUT, and wherein the probe is a temperature probe.

11. The system of claim 9, wherein the generation of the signal comprises generating a voltage, a current, or an analog or digital electronic waveform.

12. The system of claim 9, wherein the robotic arm is further configured to calibrate a position of the probe relative to the robotic arm after grasping the probe from the probe rack and before moving the probe to the physical location.

13. The system of claim 9, wherein the test fixture comprises multiple robotic arms configured to access the multiple probes in the probe rack.

14. The system of claim 13, wherein the probe is a primary probe moved by a first robotic arm to a first physical location, and wherein a second robotic arm is configured to move a secondary probe to a second location, to sense a voltage difference between the first and second physical locations.

15. The system of claim 14, wherein the processor is further configured to cause the first robotic arm to grasp the primary probe from the probe rack and to move the primary probe to the first physical location, to cause the second robotic arm to grasp the secondary probe from the probe rack and to move the secondary probe to the second physical location, to sense the voltage difference between the primary probe and the secondary probe.

16. The system of claim 9, wherein the probe is configured to measure a voltage, a current, an impedance, a signal frequency, or an analog or digital electronic waveform.

17. The system of claim 9, wherein the probe is a light sensor and measurement of the signal comprises measuring a light intensity of light generated by the target element.

18. The system of claim 9, wherein the probe is a pressure sensor and the measurement of the signal comprises measuring a mechanical pressure.

19. The system of claim 9, wherein the probe is a light emitter and the generation of the signal comprises generating a light emission.

20. The system of claim 9, wherein the robotic arm is further configured to return the probe to the probe rack after the one or more probe actions is performed and to grasp a new probe.

21. The system of claim 1, wherein the test fixture further comprises a camera configured to record a camera image of the UUT, and wherein the processor is further configured to present the camera image on the graphics display, to receive a user input indicating a position of a fiducial marker on the camera image, to calculate the corresponding physical location of the fiducial marker on the UUT, and to record the physical location, thereby calibrating physical locations of elements on the UUT defined in the CDF.

22. The system of claim 1, wherein the target element is a device, wherein the probe comprises a pressure sensor, wherein a pressure measured by the probe on the device provides feedback to control actuators of the robotic arm, to determine a height of a-the device.

23. The system of claim 1, wherein the system further comprises a camera, and wherein measurement of the signal comprises receiving an image from the camera and responsively applying image processing to determine a size of a device in the image.

24. A method for robot-assisted, interactive testing of electrical and mechanical units, the method comprising:

providing a test fixture comprising a robotic arm, a probe, and a bracket configured to hold a unit-under-test (UUT), wherein the probe is configured to be grasped by the robotic arm; and configuring a computer system, communicatively connected to the test fixture and comprising a graphics display, a user input device, and a processor and memory, the memory comprising computer-readable instructions, such that when executed by the processor perform the tasks steps of:

presenting on the graphics display a logic schematic of the UUT, receiving a user selection of a target element shown on the logic schematic, correlating the selected target element with a specification of the target element in a component placement file (CPF) describing the UUT;

determining from the specification of the target element in the CPF, coordinates of a physical location on the UUT corresponding to the target element, receiving a user input indicating one or more probe actions to perform with respect to the target element, moving the probe to the physical location indicated by the coordinates from the CPF, by means of the robotic arm, and performing the one or more probe actions at the physical location, wherein the one or more probe actions comprise a measurement or generation of one or more signals.

* * * * *